United States Patent
Asami

(10) Patent No.: US 8,649,895 B2
(45) Date of Patent: Feb. 11, 2014

(54) MANAGING METHOD OF BUILDING MATERIAL AND WIRELESS CHIP APPLIED TO THE METHOD

(75) Inventor: Yoshinobu Asami, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 1601 days.

(21) Appl. No.: 11/402,361

(22) Filed: Apr. 12, 2006

(65) Prior Publication Data

US 2006/0231974 A1    Oct. 19, 2006

(30) Foreign Application Priority Data

Apr. 19, 2005    (JP) .................................. 2005-121686

(51) Int. Cl.
*G06F 19/00*    (2011.01)

(52) U.S. Cl.
USPC ............. 700/116; 700/106; 700/221; 40/360; 209/630

(58) Field of Classification Search
USPC ................. 700/106, 115, 116, 219, 221, 223; 209/552, 599, 630, 645, 659; 40/360
See application file for complete search history.

(56) References Cited

U.S. PATENT DOCUMENTS

| | | | |
|---|---|---|---|
| 5,632,511 A * | 5/1997 | Longtin et al. | 283/62 |
| 6,529,799 B1 * | 3/2003 | Paulk et al. | 700/227 |
| 6,681,935 B1 * | 1/2004 | Lewis | 206/534 |
| 6,881,975 B2 | 4/2005 | Anzai et al. | 257/59 |
| 2002/0042662 A1 | 4/2002 | Tsukishima et al. | 700/95 |
| 2002/0125997 A1 | 9/2002 | Kashi et al. | |
| 2003/0025118 A1 | 2/2003 | Yamazaki et al. | 257/79 |
| 2003/0162312 A1 | 8/2003 | Takayama et al. | 438/22 |
| 2003/0217805 A1 | 11/2003 | Takayama et al. | 156/249 |
| 2004/0140547 A1 | 7/2004 | Yamazaki et al. | 257/686 |
| 2004/0238827 A1 | 12/2004 | Takayama et al. | 257/79 |
| 2004/0256618 A1 | 12/2004 | Imai et al. | 257/59 |
| 2005/0091821 A1 * | 5/2005 | Best et al. | 29/430 |

(Continued)

FOREIGN PATENT DOCUMENTS

| | | |
|---|---|---|
| JP | 2000-357847 | 12/2000 |
| JP | 2001-358198 | 12/2001 |

(Continued)

OTHER PUBLICATIONS

Schneider, Mike, Radio Frequency Identification (RFID) Technology and its Applications in the Commercial Construction Industry, Apr. 24, 2003, University of Kentucky, pp. 1, 3-4, 16, 30-40.*

(Continued)

*Primary Examiner* — Mohammad Ali
*Assistant Examiner* — Sheela S Rao
(74) *Attorney, Agent, or Firm* — Husch Blackwell LLP

(57) ABSTRACT

A lot of buildings have been built while it is concerned that a building material is used fraudulently. Therefore, the present invention provides a managing method of the material and a system thereof. The present invention provides a managing method including a step of attaching a sheet including a plurality of memories to each surface of a plurality of materials, a step of dividing the plurality of materials with the sheet in accordance with data in the memory, a step of constructing a building by using the divided material in accordance with the data in the memory, and a step of checking the data on the constructed building, which is stored in the plurality of memories.

42 Claims, 11 Drawing Sheets

(56) References Cited

U.S. PATENT DOCUMENTS

| | | |
|---|---|---|
| 2005/0205658 A1* | 9/2005 | Baker et al. .................... 235/375 |
| 2005/0258955 A1* | 11/2005 | Gloekler et al. ......... 340/539.13 |
| 2006/0043199 A1* | 3/2006 | Baba et al. .................... 235/492 |
| 2006/0186210 A1* | 8/2006 | Tethrake et al. .............. 235/492 |

FOREIGN PATENT DOCUMENTS

| | | |
|---|---|---|
| JP | 2004-59249 | 2/2004 |
| JP | 2004-109002 | 4/2004 |
| JP | 2005-63587 | 3/2005 |
| JP | 2005-85254 | 3/2005 |
| JP | 2005-163245 | 6/2005 |
| JP | 2005-322059 | 11/2005 |

OTHER PUBLICATIONS

"Construction Material Tracking System", Jan. 2004, Intensecomp Pte Ltd., pp. 1-5.*

US 6,943,093, 09/2005, Yamazaki et al. (withdrawn)

* cited by examiner

MANAGING METHOD OF BUILDING MATERIAL AND WIRELESS CHIP APPLIED TO THE METHOD

BACKGROUND OF THE INVENTION

1. Field of the Invention

The present invention relates to a managing method in a material dividing process and a manufacturing process and a managing method for managing and preventing a building material from being used fraudulently and a wireless chip applied to these methods.

2. Description of the Related Art

Under the conditions that many buildings are built, it is a concern that the building materials are being used fraudulently. For example, it is a problem that even though it is advertised that a particular wood material will be used, a building is constructed without using that particular wood material. This is because it is difficult for a client or builder to check whether the wood material is authentic or if the wood material is processed by the builder's office or the like.

In addition, there is a building method of specifying particular building materials, such as woodstone, or any other materials, in order to coordinate with the personal preference of a client. In cases where many materials are purchased from different suppliers, there is a concern that the project management may become too complicated.

Further, in the building industry, a concrete quality managing system has been suggested, in which an RFID tag is implanted in concrete used as a building material (see Patent Document 1).

[Patent Document 1]
Japanese Patent Laid-Open No. 2004-109002

In the Patent Document 1, it is described that an RFID is implanted in one piece of concrete. However, it becomes difficult to process that piece of concrete thereafter. Further, a system for managing building materials or preventing fraud is not constructed.

SUMMARY OF THE INVENTION

Thus, the present invention provides a managing method of general resources such as a material and a system thereof.

In view of the aforementioned problems, the present invention includes a chip attached to a certain material before the material is divided. The material can be managed by writing data regarding the material to the chip and reading the written data. The chip can be attached in a sheet state, and the attached state of the chip can be maintained even after the division of the material, such as a building material. When a building is constructed using the building material, a manager or the like can sequentially obtain data regarding the building, manage the materials, and prevent the materials from being used fraudulently.

Hereinafter, the present invention is described specifically.

A mode of the present invention is a building material managing method including a step of attaching a sheet including a plurality of memories to each surface of a plurality of materials, a step of dividing each of the plurality of materials with each sheet in accordance with data in the memories, a step of constructing a building by using the divided materials in accordance with the data in the memories, and a step of checking the data on the building, which is stored in the plurality of memories.

Another mode of the present invention is a building material managing method including a step of attaching a sheet including a plurality of write-once memories in which data on a material are stored to each surface of a plurality of the materials, a step of dividing each of the plurality of materials with each sheet and writing data on the division to the memories, a step of constructing a building by using the divided materials and writing data on the construction to the memories, and a step of checking the data on the building, which is stored in the plurality of memories.

Another mode of the present invention is a building material managing method including a step of attaching a sheet including a plurality of memories in which data on a material are stored and a log is set so as not to be written to each surface of a plurality of the materials, a step of dividing each of the plurality of materials with each sheet in accordance with the data in the memories, a step of constructing a building by using the divided materials in accordance with the data in the memories, and a step of checking the data on the building, which is stored in the memories and canceling the log of the memories so as to write the data to the memories. The memories are write-once and it is impossible to erase data therefrom. Therefore, the managed data is prevented from being falsified.

Another mode of the present invention is a building material managing method including a step of attaching a sheet including a plurality of memories in which data on a material are stored to each surface of a plurality of the materials by a first processor, a step of reading the data in the memories and dividing each of the plurality of materials with each sheet in accordance with the data by a second processor, a step of reading the data in the memories and constructing a building by using the divided materials in accordance with the data by a third processor, and a step of checking the data of the building, which is stored in the memories, and providing the data to a client by a fourth processor.

Another mode of the present invention is a building material managing method including a step of attaching a sheet including a plurality of write-once memories in which data on a material are stored to each surface of a plurality of the materials by a first processor, a step of reading the data in the memories, dividing each of the plurality of materials with each sheet, and storing data on the division by a second processor, a step of reading the data in the memories, constructing a building by using the divided materials, and storing data on the construction by a third processor, and a step of checking the data of the building, which is stored in the memories, and providing the data to a client by a fourth processor.

Another mode of the present invention is a building material managing method including a step of attaching a sheet including a plurality of memories in which data on a material are stored and a log is set so as not to be written to each surface of a plurality of the materials by a first processor, a step of dividing each of the plurality of materials with each sheet in accordance with read data in the memories by a second processor, a step of constructing a building by using the divided materials in accordance with read data in the memories by a third processor, and a step of checking the data of the building, which is stored in the memories, canceling the log of the memories so as to write the data and providing the data to a client by a fourth processor.

The present invention provides a wireless chip applied to the method.

By the present invention, a material can be managed; therefore, a use of a fraudulent material, which means fabrication or falsification, can be prevented.

Further by the present invention, even in the case of a building method via a plurality of processors, a material can be easily managed among the processors.

DETAILED DESCRIPTION OF THE INVENTION

Figure 1A:
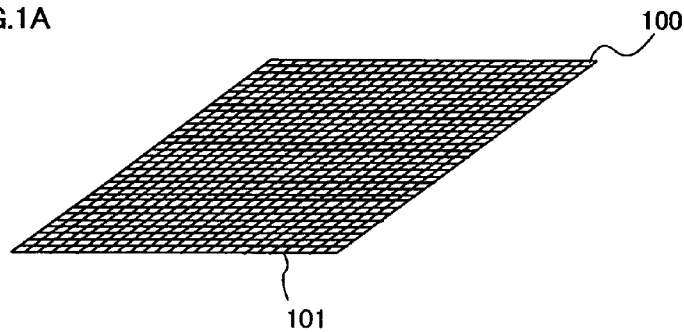
FIGS. 1A and 1B are a view showing a managing method of the present invention.

Although the present invention will be fully described by way of embodiment modes with reference to the accompanying drawings, it is to be understood that various changes and modifications will be apparent to those skilled in the art. Therefore, unless such changes and modifications depart from the scope of the present invention, they should be construed as being included therein. Note that identical portions in embodiment modes are denoted by the same reference numerals and detailed descriptions thereof are omitted.

Embodiment Mode 1

In this embodiment mode, the description is in regard to a material managing method in which a sheet including a wireless chip provided with a memory device is attached to the material.

FIG. 1A shows a sheet 101 provided with a plurality of wireless chips 100 arranged adjacent to one another. Each wireless chip 100 can receive power or a signal by wireless communication. A large number of wireless chips 100 of the present invention can be obtained from one flexible substrate. Therefore, a flexible substrate before being divided so as to obtain a large number of wireless chips can be used as the sheet 101. Such a wireless chip of the present invention is sufficiently flexible as compared to a chip formed of a silicon wafer because the wireless chip of the present invention can be formed by using a flexible substrate. Accordingly, such a flexible wireless chip can also be attached to a surface other than a flat surface. Although the sheet 101 has many wireless chips 100, there is no limitation in the number, the distance among them, the size, or the like. That is, the number, the distance among them, the size, or the like of the wireless chip 100 in the sheet 101 can be determined in accordance with a shape of a material to be attached or a shape of a flexible substrate after being divided.

Figure 1B:
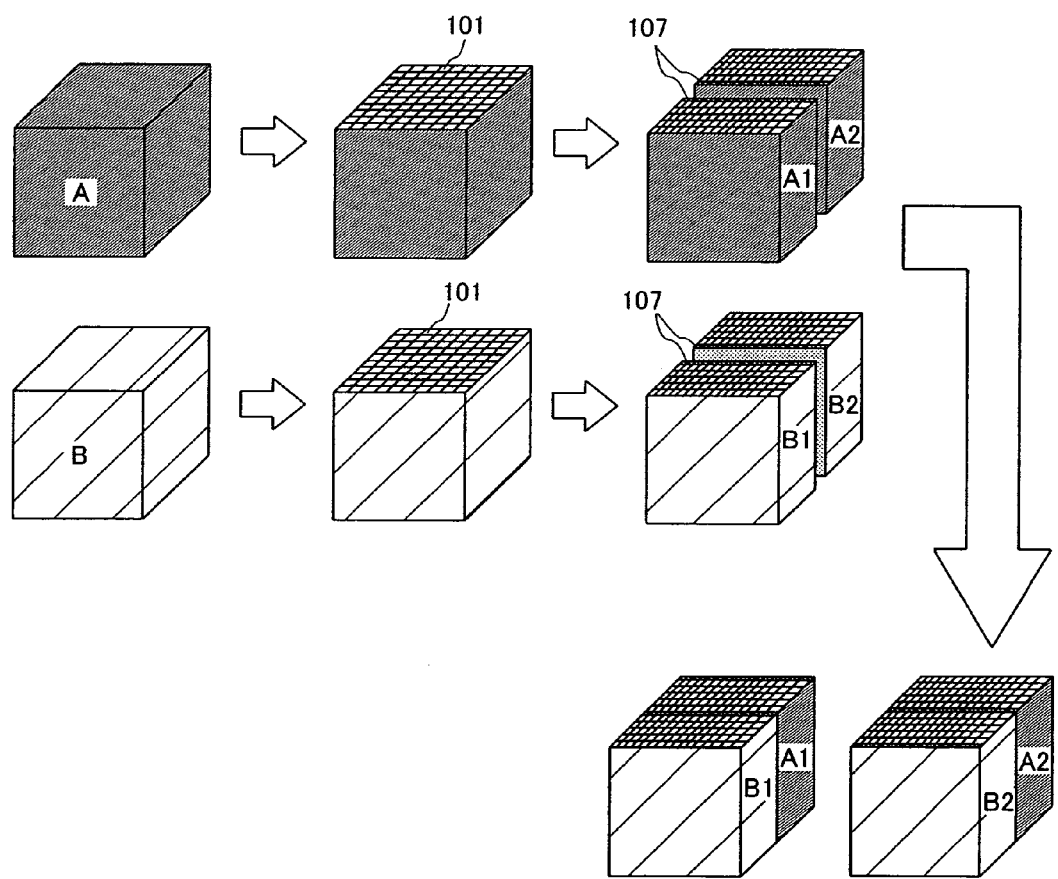

FIG. 1B shows a first material A and a second material B as a plurality of materials. The sheet 101 including wireless chips is attached to one surface of the first material A. In the same manner, the sheet 101 including wireless chips is attached to one surface of the second material B. Although in this embodiment mode, the sheet 101 is attached to one surface of each material; it may be attached to all surfaces of each material. It is to be noted that the sheet 101 is attached to all of the materials after being divided.

The wireless chip 100 of the present invention includes a memory device 102. The memory device 102 can write to/read from a memory area by wireless communication.

Table 1 shows a function and a requirement for operation of the memory device 102.

TABLE 1

| Function provided with a memory device | Requirement for operation of a memory |
|---|---|
| Switch address (s) | Operates as a switch for reading ID (A) |
| ID (A) | ID(A) can be read when a switch address (s) is turned on |
| Global ID (a)   Local ID (a) | |
| ID (B) | Reading can be carried out as required |
| Global ID (b)   Local ID (b) | |
| Write-once memory | Reading/writing can be conducted as required |

The memory device 102 includes a memory area constituting identification data ID (A) and ID (B). The identification data ID (A) and ID (B) correspond to initial data, and may be written to the memory device 102 without wireless communication. The identification data ID (A) and ID (B) can be divided into a global ID (a)/(b) for identifying that it is included in the memory device 102 in the same sheet 101 and a local ID (a)/(b) for distinguishing from the other memory devices in the same sheet 101, respectively. A global ID is an ID for identifying a substance. The same global ID is provided to each wireless chip 100 in the sheet 101 attached to the substance. On the other hand, a local ID is an ID for distinguishing the wireless chips 100 constituting the sheet 101 attached to the same substance.

Further, the memory device 102 includes a switch address (s) for controlling reading of the identification data ID (A). The switch address (s) functions and operates as a switch for reading the ID (A). Thus, the switch address (s) is stored in the memory area, and controlled to be turned on/off by a control circuit. Therefore, the switch address (s) is preferably formed of a write-once memory (a recordable memory to which data can be only written and in which data cannot be erased). The switch address (s) is initially in an off state. Note that when writing in the switch address (s) is carried out and the switch address (s) is turned on, a signal constituting a password is inputted to each wireless chip 101. In this manner, the set log can be cancelled.

On the other hand, the identification data ID (B) are set so as to be read as required. Thus, by differentiating a requirement for access to each identification data, fabrication can be prevented.

Note that in a material managing process or the like, when each memory device 102 is not required to be distinguished, the identification data ID (B) is not required to be provided.

Further, the memory device 102 includes another write-once memory. Data can be read from/write to the write-once memory as required. That is, data on a material can be written to and then read from the write-once memory. Accordingly, the read data can be provided to a client and the like.

Each of the first material A and the second material B which are attached to the sheet 101 including the memory device 102 is divided. In this embodiment mode, the description is in regard to a scenario where the materials are divided into two parts, that is, the first material A is divided into A1 and A2, and the second material B is divided into B1 and B2.

At this time, the wireless chips 100 included in the sheet 101 are also divided; thereby generating a damaged area 107. However, a plurality of the wireless chips 100 are formed in the sheet 101; therefore, it does not matter if some of them are damaged. This is because the undamaged wireless chips 100 can identify each of the first material A and the second material B.

Thereafter, a product is manufactured by combining the divided materials. In this embodiment mode, a product C1 combining A1 and B1, and a product C2 combining A2 and B2 are manufactured.

The local ID (a) and ID (b) in the memory device 102 are different from each other, thereby enabling one to distinguish A1 from A2. Further, it can be identified that A1 and A2 are processed from the same material by the global ID (a) and ID (b) which are stored in the memory device 102. In the same manner, B1 and B2 can be distinguished and identified by the local IDs and the global IDs. Accordingly, each of the product C1 (=A1+B1) and the product C2 (=A2+B2) can be identified by the global IDs and the local IDs that are stored in each memory device 102. After that, data on the process of the products C1 and C2 can also be written to the memory device 102. Accordingly, the data on the process other than the data on the material can be read and provided. The data on the process include a processing method, a process size, and the like.

Thus, processed product remains are attached to the memory device 102; therefore, data can be read from the memory device 102.

In the case where a building is constructed by using the material to which the memory device 102 is attached, data from the memory device 102 can be obtained even during the construction process; therefore, the material is prevented from being used fraudulently.

Thus, by using the present invention, quality of a material constituting a building can be managed, and a fraudulent material can be prevented from being used.

Further, by using the present invention, even in the case of a building method via a plurality of processors, a material can be easily managed among processors.

Although in this embodiment mode, a mode in which the wireless chips 100 are attached to a surface of a material, a mode in which the wireless chips 100 are implanted in a material itself may also be employed. Even in the case where a material in which the wireless chips 100 are implanted is processed, the data regarding the material and the data regarding the process can be written to the memory device 102 as aforementioned by wireless communication.

Note that although in this embodiment mode, the description is in regard to the scenario of using a building material as a material; the present invention is not limited to this. A system of the present invention can be applied to any business mode as long as it generates such an effect as aforementioned. For example, the present invention can also be applied in plants forming food products made from a plurality of ingredients or in plants forming cars from of a plurality of parts.

Embodiment Mode 2

In this embodiment mode, description is in regard to the managing method using a material to which a sheet including a plurality of memory devices is attached.

FIG. 2 shows a building process in which a building is constructed using a wood material around which the sheet 101 is wrapped.

Figure 2A:
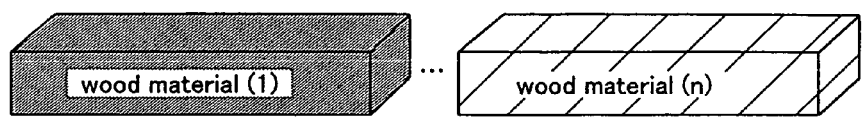
FIGS. 2A to 2D are a view showing a building process to which a managing method of the present invention is applied.

First, a plurality of divided wood materials (1) to (n) are prepared as shown in FIG. 2A. The divided wood materials (1) to (n) can be different from one another, and selected by a client. These divided wood materials may be bought from one or more suppliers. Further, the present invention can be applied to other materials besides wood, such as a wall material and a concrete material.

Figure 2B:
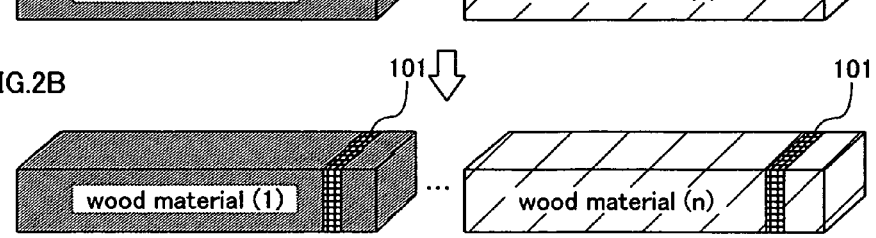
Figure 2C:
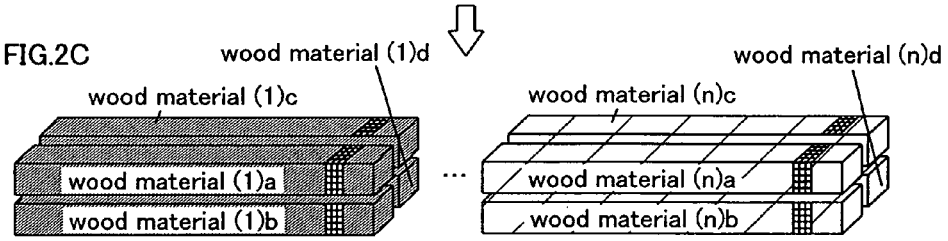

Subsequently, as shown in FIG. 2B, the sheet 101 is wrapped around so as to be attached to a part of each of the plurality of wood materials (1) to (n). Since the wood material is often divided in the longitudinal direction, the sheet 101 is wrapped around the wood material along a direction perpendicular to the longitudinal direction. The present invention is not limited to the attachment mode of the sheet 101, and the attachment mode can be determined in accordance with a subsequent mode of dividing wood or the like. That is to say, the sheet 101 is attached to all pieces of the divided wood material even after the wood material is divided.

In the memory device 102 of the sheet 101, initial data on the wood material (for example, a logging area, a divided shape, a place in which the wood is used within a building, and the like) is stored. The initial data can be stored on the memory device 102 by using a reader/writer device. Such initial data can be written to the area having a recordable memory structure shown in Table 1.

Subsequently, each wood material is cut into a predetermined shape to be used as a building material. The memory device 102 is attached to the building material even after the division; therefore, the data can be read and other data can be additionally written. The other data include data on divided time, a name of a dividing processor, and the like. Although in this embodiment mode, the mode in which each wood material is cut into a rectangle in order to be used as a pillar for a building material is shown; the present invention can be applied to a material for a wall or a roof as well as a pillar.

Figure 2D:
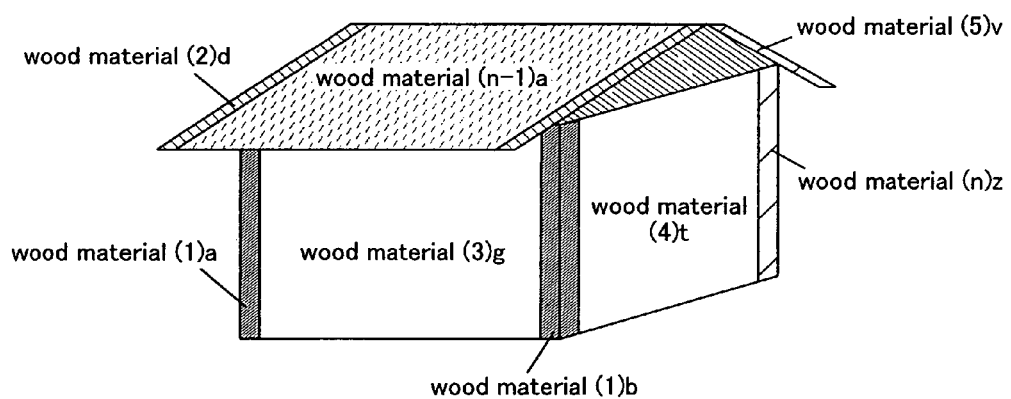

Accordingly, a building is completed by using these materials as shown in FIG. 2D. Thus, each material constituting the building can include the memory device 102, and data on the material can be obtained after the completion, that is, completion of construction. Therefore, an illegal material, an illegal use of the material, or the like can be discovered. For example, it can be discovered that a less expensive material was used in place of the desired material.

Needless to say, even in the middle of a process, data can be obtained from the memory device and written to the memory device. The data to be written may include process data on process time, a processor, and the like. In this manner, the process data is regularly obtained from the memory device in the middle of the process; therefore, an illegal material, an illegal use of the material, or the like can be discovered early.

Figure 3:
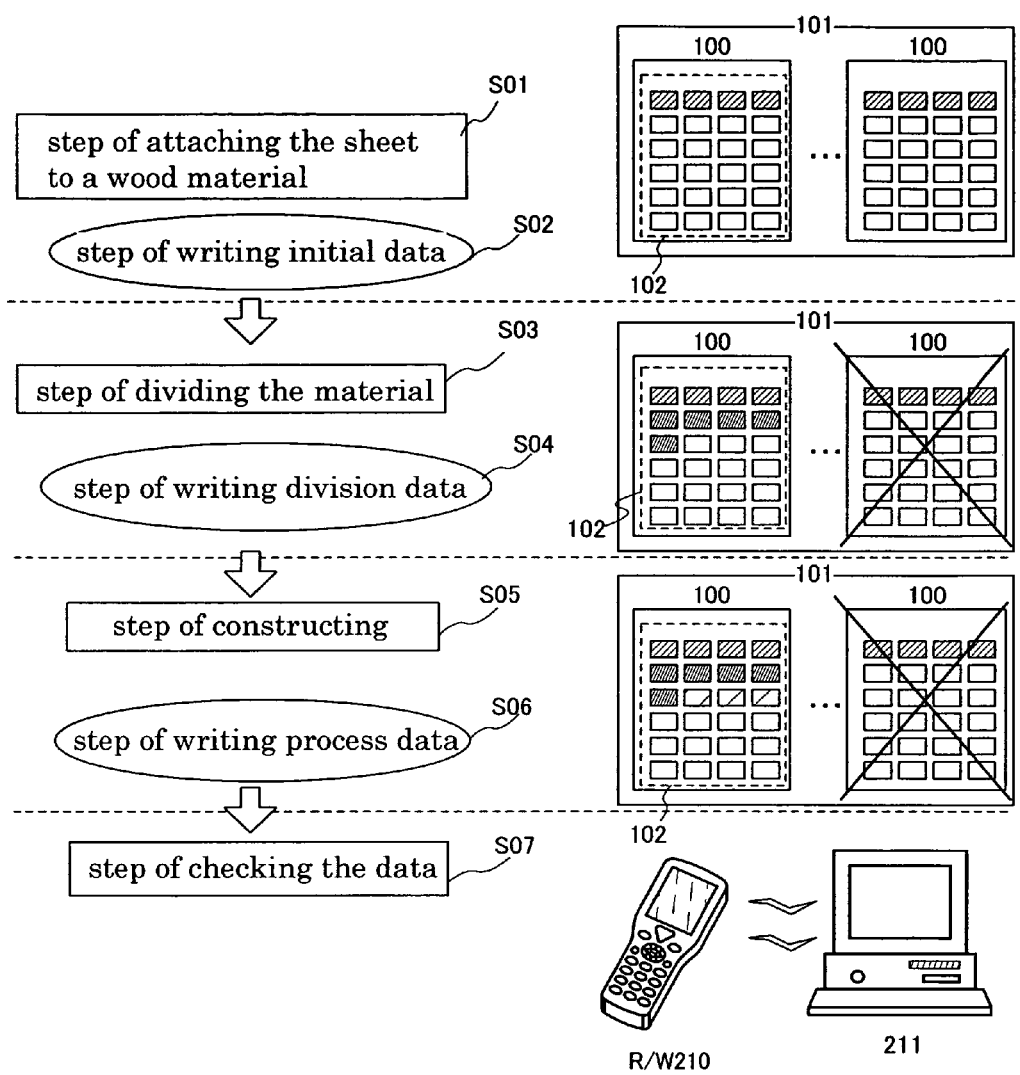
FIG. 3 is a flowchart showing a managing method of the present invention.

FIG. 3 illustrates the data exchanges shown in FIGS. 2A to 2D through a flowchart. The state of the memory device 102 is included in a wireless chip.

First, there is a step (S01) of attaching the sheet 101 to a wood material. Subsequently, there is a step (S02) of writing initial data to a memory in the wireless chips 100 included in the sheet 101. Here, the initial data is written to each memory in all of the wireless chips 100. This is because in a subsequent dividing process, an arbitrary wireless chip may be damaged. Either the step S01 or the step S02 may be carried out first.

Although the steps (S01) and (S02) are carried out by the same processor, each of them may also be carried out by a different processor. For example, the initial data may be written to the sheet 101 by a first processor, and the sheet 101 may be attached to the wood material by a second processor who receives the sheet 101 from the first processor. In such a case, the first processor and the second processor are required to make a contract to that effect.

Next, there is a step (S03) of dividing the material. At this time, there is a concern that any of the wireless chips 100 included in the sheet 101 may be damaged. However, in the present invention, a plurality of the wireless chips 100 are provided in the sheet 101 and the initial data is written to each memory included in all of the wireless chips 100; therefore, it does not matter if some of the wireless chips 100 are damaged. Thereafter, there is a step (S04) of writing division data to a memory in all of the undamaged wireless chips 100. Either the step S03 or the step S04 may be carried out in first.

Although the steps S03 and S04 can be carried out by the same processor, each step may also be carried out by a different processor. A mode similar to that discussed above for between steps S01 and S02 can be used. Further, a processor carrying out the steps S01 and S02 and a processor carrying out the steps S03 and S04 may be the same or different.

Subsequently, there is a step (SOS) of constructing a building, and then, there is a step (S06) of writing process data to a memory included in all of the undamaged wireless chips 100. Either the step S05 or the step S06 may be carried out first.

Although the steps S05 and S06 are carried out by the same processor, each step may also be carried out by a different processor. A mode similar to that discussed above for between steps S01 and S02 can be used. Further, a processor carrying out the steps S01 and S02, a processor carrying out the steps S03 and S04, and a processor carrying out the steps S05 and S06 may be the same or different.

Finally, there is a step (S07) of checking the written data. By holding a reader/writer device 210 over a material such as pillar or the like of a building, initial data, division data, and process data of the building material can be obtained by wireless communication. The obtained data can be stored in a data processing device 211 with or without wires through the reader/writer device 210. Thus, the data processing device 211 in which data is stored functions as a server.

The stored data can be provided to a client, a material supplier, a dividing processor, a process manufacturer, and the like. Accordingly, an illegal material, an illegal use of the material, or the like can be found out Note that this data can be read during the middle of the process as aforementioned.

Figure 4:
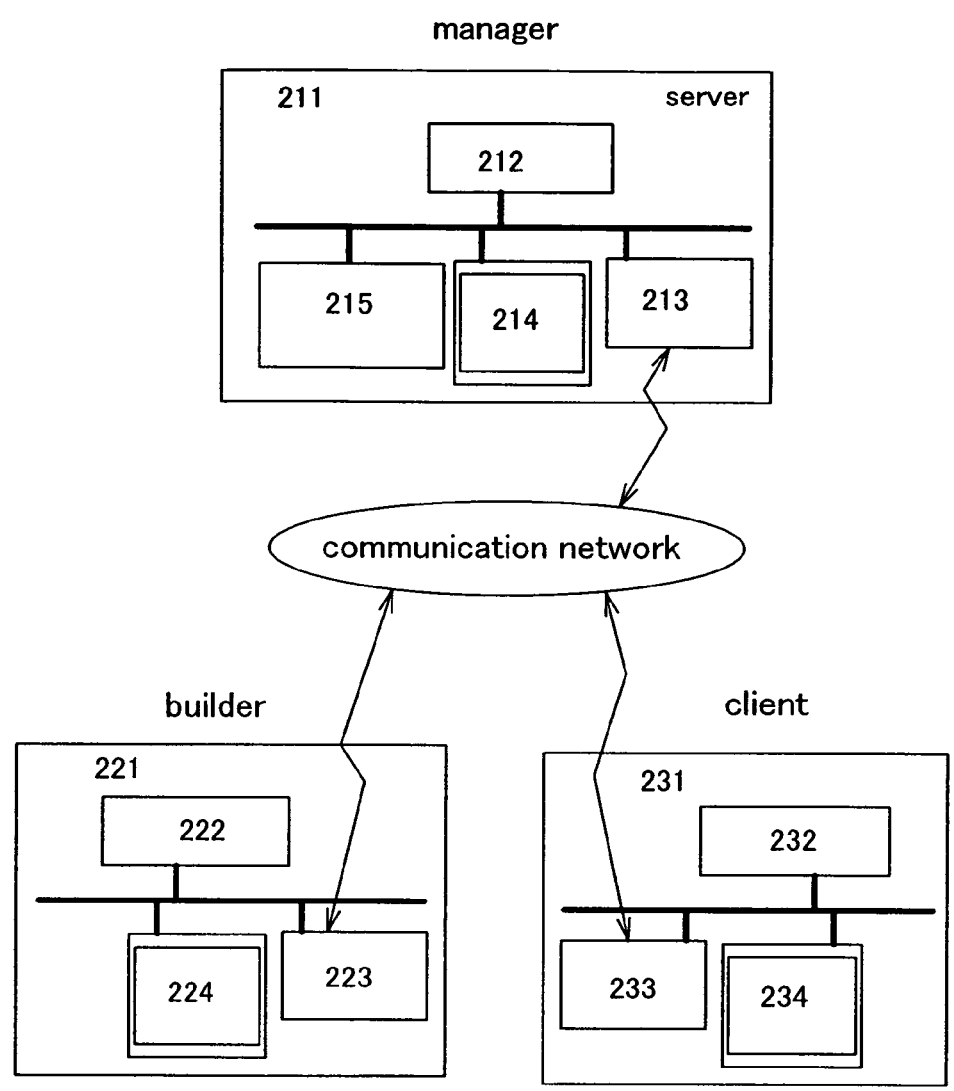
FIG. 4 is a view showing a system for carrying out a managing method of the present invention.

FIG. 4 shows a communication system among a processor (D), that is, a manager, a builder, and a client. The data processing device 211 which functions as a server possessed by the manager includes at least a central processing unit (CPU) 212, a transmitting/receiving portion 213 provided with a function of transmitting/receiving data, a database 214 in which data is stored, and a R/W interface portion 215 for communicating with the reader/writer device 210. The database 214 is provided with a memory area. These functions in the data processing device 211 are connected through a bus.

A data processing device 221 possessed by the builder includes at least a central processing unit 222, a transmitting/receiving portion 223 provided with a function of transmitting/receiving data, and a database 224. The database 224 is provided with a memory area. In addition, the data processing device 221 may also include an R/W interface portion for communicating with a reader/writer device. These functions in the data processing device 221 are connected through a bus.

A data processing device 231 possessed by the client includes at least a central processing unit 232, a transmitting/receiving portion 233 provided with a function of transmitting/receiving data, and a database 234. The database 234 is provided with a memory area. In addition, the data processing device 231 may also include an R/W interface portion for communicating with a reader/writer device. These functions in the data processing device 231 are connected through a bus.

These data processing devices can exchange data through a communication network. An internet system, telephone lines, public lines such as a mobile phone, or LAN (local area network) can be cited as the communication network. E-mail can be cited as a communication method using the communication network.

Although in this embodiment mode, description is made in regard to the scenario of using a building material as the material; the present invention is not limited to this. A system of the present invention can be applied to any business mode as long as it generates such an effect as aforementioned. For example, the present invention can also be applied in the plants forming food products made from a plurality of ingredients or in plants forming cars formed of a plurality of parts.

Embodiment Mode 3

In this embodiment mode, the description is in regard to a data managing method among processors and the system thereof.

Figure 5:
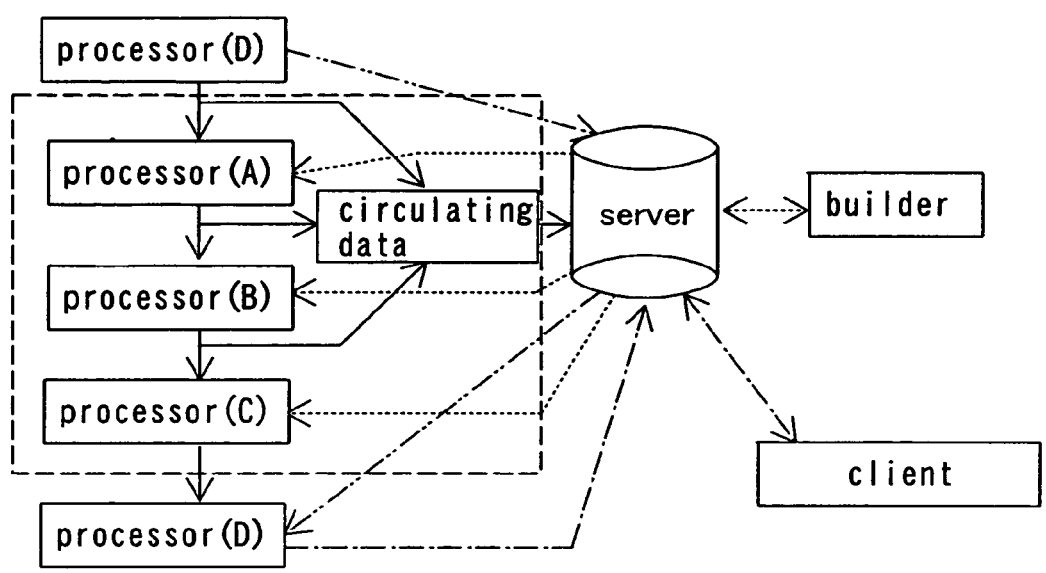
FIG. 5 is a view showing a system for carrying out a managing method of the present invention.

As shown in FIG. 5, there is a mode of completing one building by using a plurality of processors (A) to (D). For example, a processor (A) is a supplier who provides a wood material. A processor (B) is a processor who divides the wood material. A processor (C) is a builder, and a processor (D) is a data manager. The processor (D) can obtain data from a chip when construction is completed.

When the processor (A) processes the wood material, the sheet 101 is attached. At this time, the switch memory address (s) is turned off. Accordingly, an ID (a) cannot be read while an ID (b) can be read.

The processor (B) receives the wood material to which the sheet 101 is attached and cuts it into a predetermined shape. The ID (b) can be read; therefore, the processor (B) can check whether the wood material is the appropriate material or delivered through an appropriate route.

When the processor (B) uses other wood material instead of the wood material to which the sheet 101 is attached, which means a fraud, the processor (D) can discover the fraud since the other wood material does not include the sheet 101. Further, if the processor (D) cannot discover the fraud, the processor (C) can discover the fraud. The fraud can be discovered by holding the reader/writer device over the sheet 101 to obtain data in the memory and examine consistency.

The processor (C) completes construction of a building by combining the delivered wood material and the like. The ID (b) can be read; therefore, the processor (C) can discover whether the wood material is the one which is delivered through an appropriate route or not.

When the processor (C) uses other wood material instead of the wood material to which the sheet 101 is attached, which means a fraud, the processor (D) can discover the fraud since the other wood material does not include the sheet 101.

The processor (D) manages and checks the data among the processors (A) to (C). Therefore, the processor (D) has the authority to use the ID (a) and the ID (b). That is to say, the processors (A) to (C) which are squarely surrounded by a dotted line can use only the ID (b). The switch address (s) can be controlled to impart such an authority. Accordingly, credibility can be improved by the processor (D) checking data.

Data obtained by the processors (A) to (C) are collectively referred to as circulating data. Such circulating data can be managed by storing it in a server. Only the processor (D) has the authority to access this server. The authority to access this server can be managed in accordance with data in the ID (a). In FIG. 5, a flow of the data in the ID (a) is shown by a dashed double-dotted line. On the other hand, the processors (A) to (C) can only read the circulating data stored in the server.

The client can access the server and thus, determine the data in ID (a). Therefore, when the data obtained by the processor (D) is stored in the server, the client can check the obtained data sequentially. In FIG. 5, the flow of the data is shown by a dashed dotted line.

The builder stores data regarding the construction in the server. Accordingly, the processor (D) accesses the server; thereby reading the data regarding the construction and thus, determine the data in ID (a). In FIG. 5, the flow of the data regarding the construction is shown by a dotted line.

By such a system of the present invention, the quality of a material for constructing a building can be managed, which leads to preventing fraudulent materials from being used. In particular, not only after the completion of the construction but during the process of the construction, the client can check a condition through the server. Therefore, even during the process of the construction, a fraud can be discovered and the problem can be solved early, which leads to preventing the fraud from being carried out.

Further, when using the system of the present invention, even in the case of a building method via a plurality of processors, a material can be easily managed among the processors. This is because since each of the processors is provided with an authority to obtain data from the server, it is not necessary for each of them to manage and organize the data in-house. Moreover, this is because a data manager can manage a material in advance in accordance with the data in the server.

Note that although in this embodiment mode, the description is in regard to the case of using a wood material as the material; the present invention is not limited to this. A system of the present invention can be applied to any business mode as long as it generates such an effect as aforementioned. For example, the present invention can also be applied in plants forming food products made from a plurality of ingredients or in plants forming cars formed of a plurality of parts.

Embodiment Mode 4

There is a concern that the sheet including the chip may be peeled off or another sheet may be put on the material instead of the correct sheet during the process of manufacture or construction. In this embodiment mode, the description is in regard to a structure for preventing a fraud such as re-covering the sheet.

Figure 6:
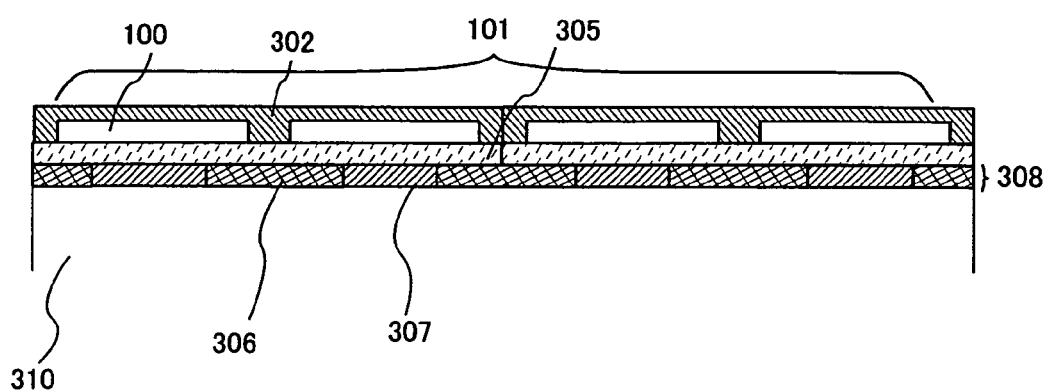
FIG. 6 is a cross sectional view of an attached chip of the present invention.

As shown in FIG. 6, the sheet 101 including a plurality of wireless chips 100 is attached to a surface of a material 310 with a barrier layer 305 interposed therebetween. Note that a protective layer 302 is provided over each surface of the plurality of wireless chips 100. The barrier layer 305 and the protective layer 302 may prevent intrusion of an impurity or moisture and an impact from the external elements. Therefore, each barrier layer 305 and protective layer 302 is preferably stacked layers of an insulating film formed of an inorganic material containing nitrogen and an insulating film formed of an organic material. Needless to say, each barrier layer 305 and protective layer 302 may also be a single layer of an insulating film formed of an inorganic material or an organic material.

Subsequently, an adhesive layer 308 is provided under the barrier layer 305. The adhesive layer 308 has a low-adhesive surface 306 and a high-adhesive surface 307. An adhesive bond or an adhesive of polyethylene series, polyvinyl acetate (PVA) series, or epoxy series can be used for the high-adhesive surface 307. On the other hand, an acrylic adhesive bond or adhesive can be used as an example for the low-adhesive surface 306. One of the adhesive bond and the adhesive can be selected considering preferred adhesiveness.

According to a cross sectional view shown in FIG. 6, the low-adhesive surface 306 and the high-adhesive surface 307 are alternately disposed. The high-adhesive surface 307 is disposed under a center portion of the wireless chip 100 and the low-adhesive surface 306 is disposed under both ends of the wireless chip 100.

The wireless chip 100 attached in this manner may be damaged when the sheet 101 is to be peeled off because of the difference of adhesive intensity. Specifically, only the low-adhesive surface 306 is to be peeled off while the high-adhesive surface 307 remains to attach to the material 310. Accordingly, the wireless chip 100 may be divided at the boundary of the low-adhesive surface 306 and the high-adhesive surface 307, and damaged.

Thus, when the sheet 101 is forcibly peeled off the wireless chip 100 is damaged. Accordingly, sheet 101 can be prevented from being peeled off or another sheet can be put on the material instead of the sheet 101.

Embodiment Mode 5

In this embodiment mode, the structure of a wireless chip is described. A device using a semiconductor element, such as a wireless chip of the present invention, can be referred to as a semiconductor device.

Figure 7:
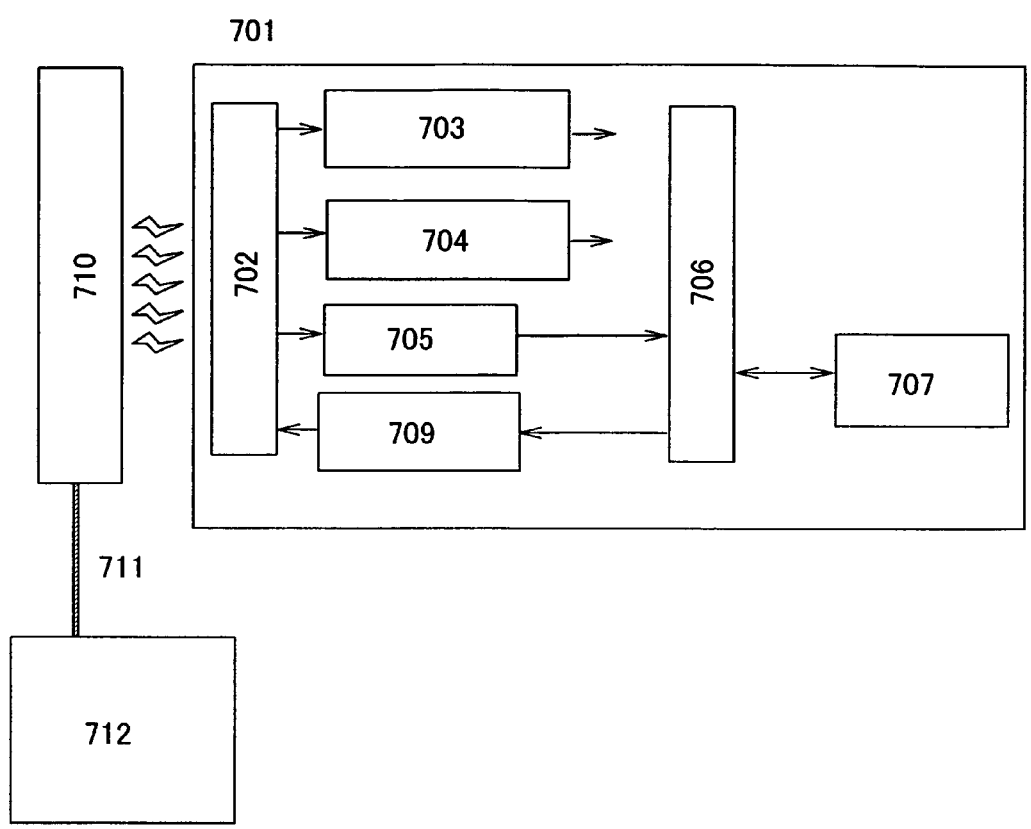
FIG. 7 is a view showing a structure of a chip of the present invention.

As shown in FIG. 7, a wireless chip 701 of the present invention includes an integrated circuit integrating an antenna. Specifically, the wireless chip 701 includes a resonant circuit 702 formed of an antenna and a resonance capacitor, a power source circuit 703, a clock generating circuit 704, a demodulating circuit 705, a controlling circuit 706, a memory device 707 provided with a write-once memory, and a modulating circuit 709. Needless to say, the wireless chip 701 is not limited to have the aforementioned structure, a central processing unit (so-called CPU), a congestion controlling circuit, or the like may also be included. Further, the memory device may include a memory element such as a static memory (SRAM), a dynamic memory (DRAM), a ferroelectric memory (FeRAM), or an EEPROM as well as the write-once memory.

In addition, the wireless chip 701 may include a wire for connecting an antenna instead of the antenna being integrated with the integrated circuit. In this case, when the wireless chip 701 is used, a separately manufactured antenna is connected to the wire.

Further, the wireless chip 701 may include a wire for connecting a memory device instead of the memory device 707. In this case, when the wireless chip 701 is used, the separately manufactured memory device 707 is connected to the wire.

The wireless chip 701 of the present invention receives a radio wave beamed from a reader/writer device 710 in the resonant circuit 702; therefore, a power source potential is generated in the power source circuit 703. Further, data is demodulated by the radio wave received in the demodulating circuit 705. The data is transmitted by the modulating circuit 709. In this manner, the data can be transmitted/received by wireless communication between the wireless chip 701 and the reader/writer device 710.

The reader/writer device 710 is connected to a data processing device 712 through a communication line 711. Accordingly, the data can be transmitted/received between the reader/writer device 710 and the wireless chip 701 under the control of the data processing device 712. A computer is cited as the data processing device 712. Although the communication line 711 has a wired mode, the data may be exchanged by wireless communication, such as infrared communication.

The resonant circuit 702 receives a radio wave beamed from the reader/writer device 710; therefore, an alternating signal can be generated at both ends of the antenna. The alternating signal can power the wireless chip 701, and include data such as an instruction transmitted from the reader/writer device 710. In the power source circuit 703, the alternating signal generated in the resonant circuit 702 is rectified with a diode and smoothed using capacitance; thereby generating a power source potential and supplying it to each circuit. The clock generating circuit 704 generates clock signals having various frequency in accordance with the alternating signal generated in the resonant circuit 702. The demodulating circuit 705 demodulates data included in the alternating signal generated in the resonant circuit 702.

The controlling circuit 706 can sample an instruction from the demodulated signal, transmit the instruction to write in the memory device 707, and store data which is stored in a register in a predetermined memory area within the memory device 707. Needless to say, data may be stored without having the register mediated. A signal decoded by a decoding circuit within the controlling circuit 706 is generated so as to be outputted to the modulating circuit 709. The modulating circuit 709 has a function to modulate a carrier wave in accordance with the decoded signal.

The memory device 707 is provided with a write-once memory, or the like. The stored data can be written to the memory device 707. Further, the written data can be read.

Although in this embodiment mode, the description is in regard to an example in which power is supplied to the wireless chip 701 from the reader/writer device 710, the present invention is not limited to this mode. For example, the wireless chip 701 can include a battery or the like internally so as to supply power, and data can be only transmitted/received wirelessly between the wireless chip 701 and the reader/writer device 710. Since the wireless chip 701 mounted on a building has no restraint in thickness, the battery or the like can be included within the wireless chip 701.

Note that this embodiment mode can be implemented by freely being combined with any of the aforementioned embodiment modes.

Embodiment Mode 6

In this embodiment mode, the description is in regard to a mode of the memory device 707 included in the wireless chip 701 and an operating method thereof.

Figure 8:
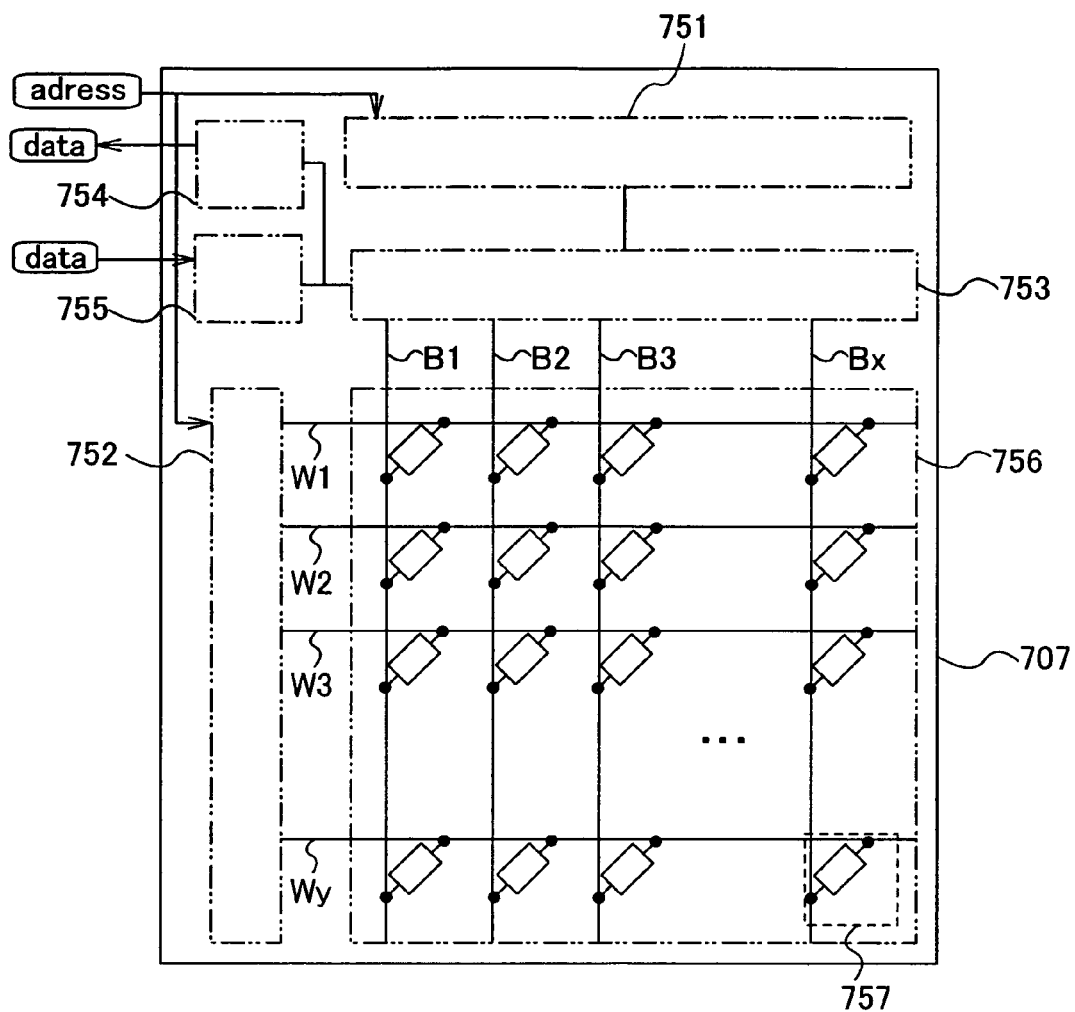
FIG. 8 is a view showing a memory device of the present invention.

As shown in FIG. 8, the memory device 707 includes a memory cell array 756 in which a memory element is formed and a driver circuit. The driver circuit includes a column decoder 751, a row decoder 752, a reading circuit 754, a writing circuit 755, and a selector 753.

The memory cell array 756 has a memory cell 757 at each intersection of a bit line Bm (m=1 to x) and a word line Wn (n=1 to y). Note that the memory cell 757 may be either an active memory cell to which a transistor is connected or a passive memory cell formed of only a passive element. Further, the bit line Bm is controlled by the selector 753 while the word line Wn is controlled by the row decoder 752.

The column decoder 751 receives an address signal for specifying an arbitrary bit line and transmits the signal to the selector 753. The selector 753 selects a specified bit line after receiving a signal of the column decoder 751. The row decoder 752 selects a specified word line after receiving an address signal for specifying an arbitrary word line. As a result of the aforementioned operation, one memory cell 757 corresponding to the address signals is selected. The reading circuit 754 reads and outputs data included in the selected memory cell 757. The writing circuit 755 generates a voltage required for writing, and applies the voltage to the selected memory cell 757; thereby writing the data.

Subsequently, a circuit configuration of the memory cell 757 is described. In this embodiment mode, the description is in regard to the circuit configuration of the memory cell 757 including a memory element 783 in which a memory material layer is interposed between an under side electrode and an upper side electrode.

Figure 9A:
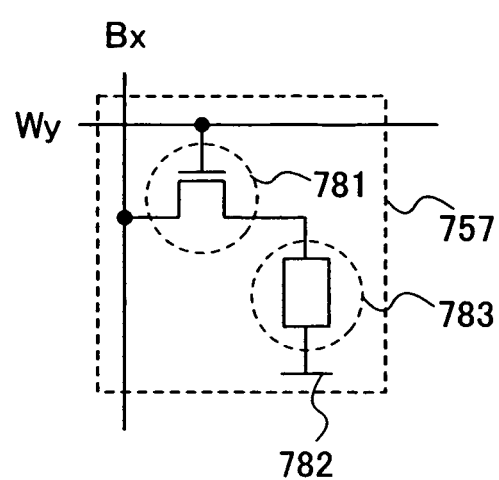
FIGS. 9A and 9B are circuit diagrams showing a memory element of the present invention.

The memory cell 757 shown in FIG. 9A is an active memory cell including a transistor 781 and the memory element 783. A thin film transistor can be used for the transistor 781. A gate electrode of the transistor 781 is connected to the word line Wy. Further, one of a source electrode and a drain electrode of the transistor 781 is connected to the bit line Bx while the other is connected to the memory element 783. The under side electrode of the memory element 783 is connected to one of the source electrode and the drain electrode of the transistor 781. The upper side electrode (corresponds to a reference numeral 782) of the memory element 783 can be shared in each memory element 783 as a common electrode. The upper side electrode 782 can be connected to ground.

Figure 9B:
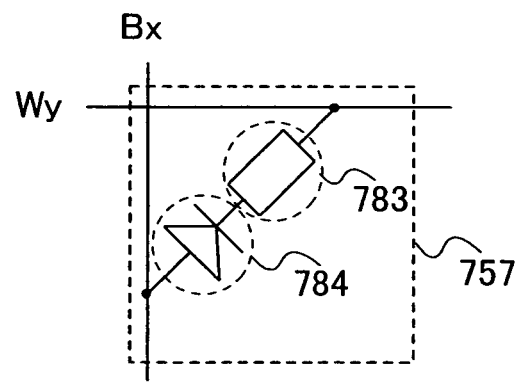

Alternatively, as shown in FIG. 9B, a structure may be employed in which the memory element 783 is connected to a diode 784. A transistor in which one of a source electrode and a drain electrode and a gate electrode are connected to each other (so-called diode-connected) can be used as the diode 784. Alternatively, a Schottky diode formed by a contact of a memory material layer and an under side electrode can be used, or a diode formed by stacking layers of the memory material can be utilized as the diode 784.

A material which is changed in the property or condition thereof by an electric action, an optical action, or a thermal action can be used as the memory material layer. For example, a material can be used which can make an under side electrode and an upper side electrode short-circuited by the change in the property or condition thereof due to melting by Joule heat, dielectric breakdown, or the like. Therefore, the memory material layer may have a thickness of from 5 nm to 100 nm, preferably, from 10 nm to 60 nm. The memory material layer can be made of an inorganic material or an organic material, and can be formed by a vapor deposition method, a spin coating method, a droplet discharge method, or the like.

Silicon oxide, silicon nitride, silicon oxynitride, or the like can be used as the inorganic material. Also by using such an inorganic material, dielectric breakdown can be generated by controlling the thickness thereof and the under side electrode and the upper side electrode can be short-circuited.

The organic material can be, for example, a compound of aromatic amine series (that is, a bond of benzene ring nitrogen is included), such as 4,4'-bis[N-(1-naphthyl)-N-phenylamino]-biphenyl (abbreviated to α-NPD), 4,4'-bis[N-(3-methylphenyl)-N-phenylamino]-biphenyl (abbreviated to TPD), 4,4',4"-tris(N,N-diphenylamino)-triphenylamine (abbreviated to TDATA), 4,4',4"-tris[N-(3-methylphenyl)-N-phenylamino]-triphenylamine (abbreviated to MTDATA), or 4,4'-bis(N-(4-(N,N-di-m-tolylamino)phenyl)-N-phenylamino) biphenyl (abbreviated to DNTPD); polyvinyl carbazole (PVK); a phthalocyanine compound such as phthalocyanine (abbreviated to $H_2Pc$), copper phthalocyanine (abbreviated to CuPc), or vanadyl phthalocyanine (abbreviated to VOPc); or the like. These materials are substances having a high hole transporting property.

Further, the organic material can be, for example, a material made of a metal complex or the like having a quinoline skeleton or a benzoquinoline skeleton, such as tris(8-quinolinolato) aluminum (abbreviated to $Alq_3$), tris(4-methyl-8-quinolinolato) aluminum (abbreviated to $Almq_3$), bis(10-hydroxybenzo[h]-quinolinato) beryllium (abbreviated to $BeBq_2$), or bis(2-methyl-8-quinolinolato)-4-phenylphenolato-aluminum (abbreviated to BAlq) or a material such as a metal complex having a ligand of oxazole series or thiazole series, such as bis[2-(2-hydroxyphenyl)benzoxazolato]zinc (abbreviated to $Zn(BOX)_2$) or bis[2-(2-hydroxyphenyl)benzothiazolato]zinc (abbreviated to $Zn(BTZ)_2$). These materials are substances having a high electron transporting property.

Furthermore, in addition to a metal complex, a compound or the like such as 2-(4-biphenylyl)-5-(4-tert-butylphenyl)-1,3,4-oxadiazole (abbreviated to PBD), 1,3-bis[5-(p-tert-butylphenyl)-1,3,4-oxadiazole-2-yl]benzene (abbreviated to OXD-7), 3-(4-tert-butylphenyl)-4-phenyl-5-(4-biphenylyl)-1,2,4-triazole (abbreviated to TAZ), 3-(4-tert-butylphenyl)-4-(4-ethylphenyl)-5-(4-biphenylyl)-1,2,4-triazole (abbreviated to p-EtTAZ), bathophenanthroline (abbreviated to BPhen), or bathocuproin (abbreviated to BCP) can be used.

The memory material layer may be formed of a single layer or stacked layers. In the case of stacked layers, stacked layers can be formed by selecting from the above materials. The above organic material and a light-emitting material may be stacked. As a light-emitting material, 4-dicyanomethylene-2-methyl-6-[2-(1,1,7,7-tetramethyljulolidine-9-yl)ethenyl]-4H-pyran (abbreviated to DCJT), 4-dicyanomethylene-2-t-butyl-6-[2-(1,1,7,7-tetramethyljulolidine-9-yl)ethenyl]-4H-pyran, periflanthene, 2,5-dicyano-1,4-bis[2-(10-methoxy-1,1,7,7-tetramethyljulolidine-9-yl)ethenyl]benzene, N,N'-dimethylquinacridone (abbreviated to DMQd), coumarin 6, coumarin 545T, tris(8-quinolinolato) aluminum (abbreviated to $Alq_3$), 9,9'-bianthlyl, 9,10-diphenylanthracene (abbreviated to DPA), 9,10-bis(2-naphthyl) anthracene (abbreviated to DNA), 2,5,8,11-tetra-t-buthylperylene (abbreviated to TBP), and the like are suggested.

A layer in which the above light-emitting material is dispersed may be used. In the layer in which the above light-emitting material is dispersed, an anthracene derivative such as 9,10-di(2-naphthyl)-2-tert-butylanthracene (abbreviated to t-BuDNA); a carbazole derivative such as 4,4'-bis(N-carbazolyl) biphenyl (abbreviated to CBP); a metal complex such as bis[2-(2-hydroxyphenyl)pyridinato]zinc (abbreviated to $Znpp_2$) or bis[2-(2-hydroxyphenyl)benzoxazolate]zinc (abbreviated to ZnBOX); or the like can be used as a host material. In addition, tris(8-quinolinolato) aluminum (abbreviated to $Alq_3$), 9,10-bis(2-naphthyl) anthracene (abbreviated to DNA), bis(2-methyl-8-quinolinolato)-4-phenylphenolate-aluminum (abbreviated to BAlq), or the like can be used.

The organic material preferably has a high glass transition temperature (Tg) of from 50° C. to 300° C., preferably from 80° C. to 120° C., so that the property of the organic material is changed by a thermal effect or the like.

In addition, a material such as an organic material or a light-emitting material may be mixed with a metal oxide. Note that the material in which metal oxide is mixed includes a state in which metal oxide is mixed with the above organic material or the above light-emitting material, or a state in which metal oxide and the above organic material or the above light-emitting material are stacked. Specifically, it indicates a state which is formed by a co-evaporation method using multiple evaporation sources. Such a material in which metal oxide is mixed with an organic material or a light-emitting material can be referred to as an organic-inorganic composite material.

For example, in the case of mixing a substance having a high hole transporting property with metal oxide, it is preferable to use vanadium oxide, molybdenum oxide, niobium oxide, rhenium oxide, tungsten oxide, ruthenium oxide, titanium oxide, chromium oxide, zirconium oxide, hafnium oxide, and tantalum oxide as the metal oxide.

In the case of mixing a substance having a high electron transporting property with metal oxide, it is preferable to use lithium oxide, calcium oxide, sodium oxide, kalium oxide, or magnesium oxide is as the metal oxide.

A material which is changed in its property by an optical effect, an electric effect, or a thermal effect can be used for the memory material layer; therefore, for example, a conjugated polymer doped with a compound (photoacid generator) generating acid by means for absorbing light can also be used. Here, polyacetylenes, polyphenylene vinylenes, polythiophenes, poly anilines, polyphenylene ethinylenes, or the like can be used as the conjugated polymer. Aryl sulfonium salt, aryl iodonium salt, o-nitrobenzyl tosylate, aryl sulfonic acid p-nitrobenzyl ester, sulfonyl acetophenones, Fe-arene complex $PF_6$ salt, or the like can be used as the photoacid generator.

Next, an operation at the time of writing data in the active type memory cell 757 shown in FIG. 9A is described. In this embodiment mode, a logical value which is stored in a memory element at an initial state is denoted by "0" and a logical value which is stored in a memory element in which the characteristics thereof is changed by an electric effect or the like is denoted by "1". The memory element at an initial state has high resistance while the memory element in which an upper side electrode and an under side electrode are short-circuited has low resistance.

In the case where writing is carried out, a bit line Bm in an m-th column and a word line Wn in an n-th row are selected by the column decoder 751, the row decoder 752, and the selector 753; thereby turning on the transistor 781 included in the memory cell 757 in the m-th column and the n-th row.

Subsequently, a predetermined voltage is applied to the bit line Bm in the m-th column by the writing circuit 755 in a predetermined period. A voltage and time for the application is determined according to a requirement that a state of the memory element 783 is changed from an initial state to a short-circuited state with low resistance. The voltage applied to the bit line Bm in the m-th column is transmitted to the under side electrode of the memory element 783, which results in potential difference between the under side electrode and the upper side electrode. Then, a current flows to the memory element 783, a state of the memory material layer is changed, and characteristics of the memory element 783 are changed. Accordingly, a value stored in the memory element 783 is changed from the logical value "0" to the logical value "1".

Such a writing operation is carried out in accordance with the controlling circuit 706.

Figure 10:
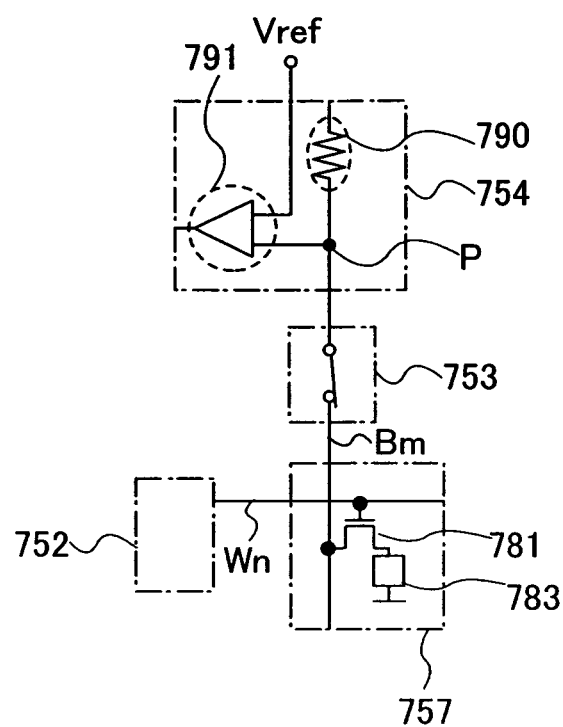
FIG. 10 is a circuit diagram showing an operation of a memory device of the present invention.

Next, an operation of reading data is described. As shown in FIG. 10, the reading circuit 754 has a resistance element 790 and a sense amplifier 791. Data is read by applying a voltage between the under side electrode and the upper side electrode to determine the memory element 783 is at either an initial state or a short-circuited state. Specifically, data can be read by a resistance dividing method.

For example, the description is in regard to the case of reading data in the memory element 783 in the m-th column and the n-th row from a plurality of the memory cells 757.

First, the bit line Bm in the m-th column and the word line Wn in the n-th row are selected by the column decoder 751, the row decoder 752, and the selector 753. At this time, an address signal to select a specific bit line and word line is inputted to the column decoder 751. Thus, the transistor 781 included in the memory cell 757 arranged in the m-th column and the n-th row is turned on; therefore, the memory element 783 and the resistance element 790 are connected in series. Accordingly, a potential at a point P shown in FIG. 10 is determined in accordance with current characteristics of the memory element 783. Electric characteristics of the memory element 783 results from the change in resistance of the memory element 783 between the initial state and the short-circuited state.

For example, the potential at the point P is referred to as V1 in the case where the memory element 783 is at the initial state, and the potential at the point P is referred to as V2 in the case where the memory element 783 is at the short-circuited state with low resistance. By applying a reference potential Vref which satisfies V1>Vref>V2, data stored in the memory element 783 can be read. Specifically, in the case where the memory element 783 is at the initial state, an output potential of the sense amplifier 791 becomes Lo. On the other hand, in the case where the memory element 783 is at the low-resistance state, an output potential of the sense amplifier 791 becomes Hi.

According to the aforementioned method, the data in the memory element 783 is read with a voltage value by using resistance division and a difference in a resistance value of the memory element 783. Alternatively, the data in the memory element 783 may be read with a current value. Note that the reading circuit 754 of the present invention is not limited to the aforementioned configuration. Any configuration may be used for the reading circuit 754 as long as the data in the memory element 783 can be read.

The memory element 783 having such a configuration changes a state from a logical value "0" to a logical value "1". The change from a logical value "0" to a logical value "1" is irreversible; therefore, the memory element becomes a write-once memory, that is, a memory element in which rewriting cannot be conducted.

Data can be thus written to the memory element 783. The written data can be read by wireless communication.

In this way, data on a building can be sequentially stored in a memory device, and the stored data can be read by a reader/writer device.

Note that this embodiment mode can be implemented by freely combined with any of the aforementioned embodiment modes.

Embodiment Mode 7

In this embodiment mode, the description is in regard to a cross-sectional view of the memory device 707.

Figure 11A:
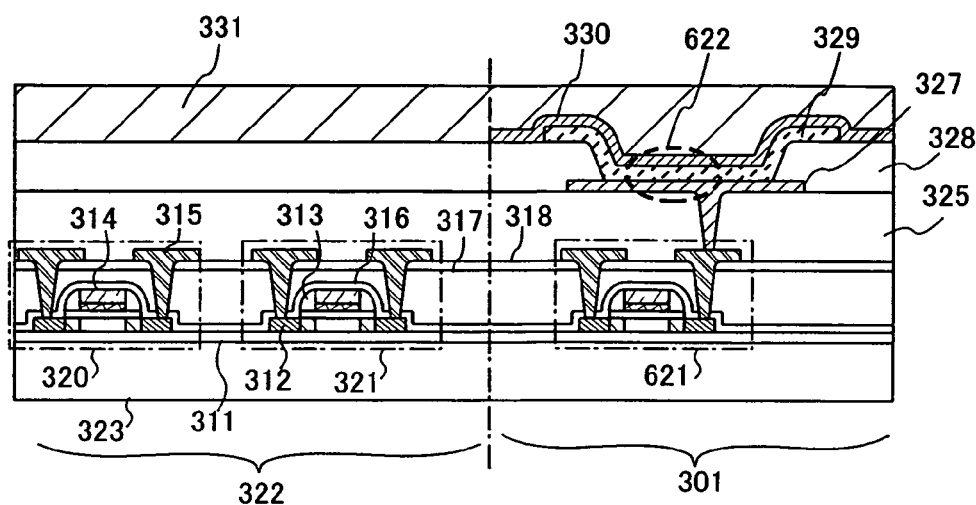
FIGS. 11A and 11B are cross sectional views showing a memory device of the present invention.

FIG. 11A shows a cross sectional view of a memory device in which a memory cell portion 301 and a control circuit portion 322 are formed over an insulating substrate 323. A substrate such as a glass substrate, a quartz substrate, or a substrate made of silicon or a metal substrate can be used as the insulating substrate 323.

A base film 311 is formed over the insulating substrate 323. Thin film transistors 320 and 321 are provided in the driver circuit portion 322. In the memory cell portion 301, a thin film transistor 621 is provided with the base film 311 interposed therebetween. Each thin film transistor has a semiconductor film 312 patterned in an island shape, a gate electrode 314 provided with the gate insulating film interposed therebetween, and an insulator (so-called sidewall) 313 provided on a side face of the gate electrode 314. The semiconductor film 312 is formed so as to have a film thickness of 0.2 μm or less, typically, from 40 nm to 170 nm, preferably, from 50 nm to 150 nm.

Further, each thin film transistor has the sidewall 313, an insulating film 316 for covering the semiconductor film 312, and an electrode 315 which is connected to an impurity region formed in the semiconductor film 312. Note that the electrode 315 can be formed to connect to the impurity region by forming a contact hole in the gate insulating film and the insulating film 316, forming a conductive film in the contact hole, and patterning the conductive film.

Insulating films 317 and 318, each of which functions as an interlayer insulating film, are preferably provided to enhance flatness. The insulating film 317 is preferably made of an organic material, and the insulating film 318 is preferably made of an inorganic material. This is because the insulating film 318 prevents moisture from entering into the insulating film 317. In the case where the insulating films 317 and 318 are provided, the electrode 315 can be formed so as to connect to the impurity region through the contact hole formed in the insulating films 317 and 318 as well as in the gate insulating film and the insulating film 316.

In addition, an insulating film 325 is formed, and an under side electrode 327 of a memory element is provided so as to connect to the electrode 315. At this time, the under side electrode 327 may be provided directly over the electrode 315; however, in this embodiment mode, the insulating film 325 is provided, and the electrode 315 and the under side electrode 327 are connected through an opening portion in the insulating film 325. It is preferable that the flatness of a surface to be formed on the under side electrode 327 be enhanced by the insulating film 325.

An insulating film 328, in which an opening portion is provided so as to expose the under side electrode 327, is formed to cover an end portion of the under side electrode 327.

In the opening portion, a memory material layer 329 and an upper side electrode 330 are formed in this order. Thus, the memory element 783 including the under side electrode 327, the memory material layer 329, and the upper side electrode 330 is formed. The memory material layer 329 can be made of an organic material or an inorganic material as described in the above embodiment mode. The under side electrode 327 or the upper side electrode 330 can be made of a conductive material, for example, a film made of an element of aluminum (Al), titanium (Ti), molybdenum (Mo), tungsten (W), or silicon (Si) or an alloy film or the like using these elements. Further, indium tin oxide (ITO), indium tin oxide containing silicon oxide, or a light transmissive material such as indium oxide containing 2 to 20 wt % of zinc oxide can be used.

Thereafter, an insulating film 331 is formed to seal. The insulating film 331 can also enhance flatness further and prevent the intrusion of an impurity element.

Each insulating film described in this embodiment mode can be an inorganic material or an organic material. Silicon oxide or silicon nitride can be used for the inorganic material. Polyimide, acrylic, polyamide, polyimide amide, resist, benzocyclobutene, siloxane, or polysilazane can be used as the organic material. Note that a siloxane resin corresponds to a resin including a Si—O—Si bond. A skeleton structure of siloxane is formed by the bond of silicon (Si) and oxygen (O). An organic group containing at least hydrogen (for example, alkyl group or aromatic hydrocarbon) is used as a substituent included in siloxane. Alternatively, a fluoro group may be used as the substituent. Further alternatively, a fluoro group and an organic group containing at least hydrogen may be used as the substituent. Polysilazane is formed by using a polymer material having a bond of silicon (Si) and nitrogen (N) as a starting material. Note that the organic material is preferably used to enhance flatness while the inorganic material is preferably used to prevent the intrusion of an impurity element.

Figure 11B:
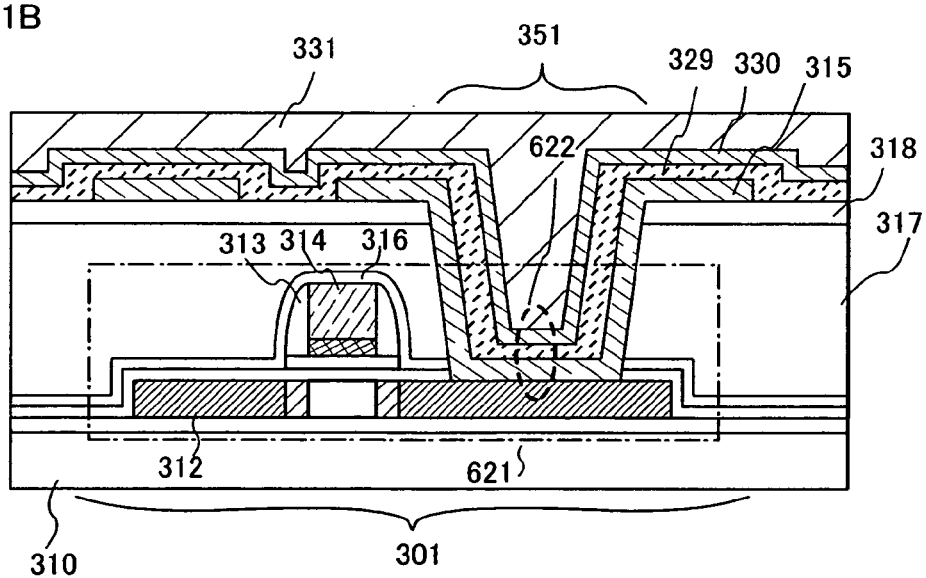

FIG. 11B differs from FIG. 11A in showing a cross sectional view of only the memory cell portion 301 in which a memory material layer is formed in a contact hall 351 of the electrode 315. Similarly to FIG. 11A, the electrode 315 is used as an under side electrode, and the memory material layer 329 and the upper side electrode 330 are formed over the electrode 315; thereby forming a memory element 622. FIG. 11B shows a mode in which the insulating films 325 and 328 are omitted. The structure of other parts is similar to FIG. 11A; therefore, the similar parts are denoted by the same reference numerals in FIG. 11A and explanation thereof is omitted.

By forming the memory element 622 in the contact hole 351 as shown in FIG. 11B, a reduction in size of a memory device can be achieved. Further, an electrode for a memory is not required since the electrode 315 also functions as an under side electrode. Accordingly, a low cost memory device can be provided by reducing the manufacturing process.

Thus, the memory device which can be applied to a building material managing system of the present invention is formed over an insulating substrate and has a driver circuit integrated in the memory device; therefore, the manufacturing cost of the memory device can be reduced.

Note that this embodiment mode can be implemented by freely combining it with any of the above-mentioned embodiment modes.

This application is in accordance with Japanese Patent Application serial no. 2005-121686 filed in Japan Patent Office on 19, Apr., 2005, the entire contents of which are hereby incorporated by reference.

What is claimed is:

1. A material management method comprising the steps of:
    attaching a sheet including a plurality of memories each storing data of a material to a surface of the material;
    dividing the material into pieces, together with the sheet in accordance with data in the memories, so that the pieces of the material each carry at least one of the memories;
    constructing a building by using the divided material in accordance with data in the memories; and
    checking the data on the constructed building, which is stored in the memories.

2. The material management method according to claim 1, wherein the data is stored in a server through a reader/writer device.

3. The material management method according to claim 1, wherein the plurality of memories are protected from the data erasing.

4. The material management method according to claim 1, wherein the material is a wood material.

5. The material management method according to claim 1, wherein each of the plurality of memories has the same data.

6. A material management method comprising the steps of:
    attaching a sheet including a plurality of write-once memories each storing data of a material to a surface of the material;
    dividing the material into pieces, together with the sheet in accordance with the data in the write-once memories, so that the pieces of the material each carry at least one of the memories;
    writing data on the dividing step in the write-once memories;
    constructing a building by using the divided material;
    writing data on the construction in the write-once memories; and
    checking the data on the constructed building, which is stored in the write-once memories.

7. The material management method according to claim 6, wherein the data is stored in a server through a reader/writer device.

8. The material management method according to claim 6, wherein the plurality of memories are protected from the data erasing.

9. The material management method according to claim 6, wherein the material is a wood material.

10. The material management method according to claim 6, wherein the step of dividing the material is conducted after the step of writing data on the dividing step.

11. The material management method according to claim 6, wherein the step of dividing the material is conducted before the step of writing data on the dividing step.

12. The material management method according to claim 6, wherein the step of constructing the building is conducted after the step of writing data on the construction.

13. The material management method according to claim 6, wherein the step of constructing the building is conducted before the step of writing data on the construction.

14. The material management method according to claim 6, wherein each of the plurality of memories has the same data.

15. A material management method comprising the steps of:
    attaching a sheet including a plurality of memories each storing data of a material to a surface of the material;
    wherein data on the material are stored in the plurality of memories and a log preventing a writing is set in the plurality of memories;
    dividing the material into pieces, together with the sheet in accordance with data in the memories, so that the pieces of the material each carry at least one of the memories;
    constructing a building by using the divided material in accordance with the data in the memories;
    checking the data on the building, which is stored in the memories;
    canceling the log of the memories; and
    writing data in the memories.

16. The material management method according to claim 15, wherein the data is stored in a server through a reader/writer device.

17. The material management method according to claim 15, wherein the plurality of memories are protected from the data erasing.

18. The material management method according to claim 15, wherein the material is a wood material.

19. The material management method according to claim 15, wherein each of the plurality of memories has the same data.

20. A material management method comprising the steps of:
    attaching a sheet including a plurality of memories to a surface of a material, data of the material having been stored in each of the memories by using a first processor;
    reading, by using a second processor, the data in the memories, and dividing the material into pieces, together with the sheet in accordance with the data, so that the pieces of the material each carry at least one of the memories;

reading, by using a third processor, the data in the memories, and constructing a building by using the divided material in accordance with the data; and checking, by using a fourth processor, the data on the building, which is stored in the memories and providing the data to a client.

21. The material management method according to claim 20, wherein the data is stored in a server through a reader/writer device.

22. The material management method according to claim 21, wherein the stored data is provided to the client and first to fourth processors through a bus.

23. The material management method according to claim 20, wherein the plurality of memories are protected from the data erasing.

24. The material management method according to claim 20, wherein the material is a wood material.

25. The material management method according to claim 20, wherein each of the plurality of memories has the same data.

26. A material management method comprising the steps of:

attaching a sheet including a plurality of write-once memories to a surface of a material, data of the material having been stored in each of the write-once memories by using a first processor;

reading, by using a second processor, the data in the write-once memories, dividing the material into pieces, together with the sheet, so that the pieces of the material each carry at least one of the memories, and storing data on the dividing step by using the second processor;

reading, by using a third processor, the data in the write-once memories, constructing a building by using the divided material, and storing data on the construction by using the third processor; and checking, by using a fourth processor, the data on the building, which is stored in the write-once memories and providing the data to a client by using the fourth processor.

27. The material management method according to claim 26, wherein the data is stored in a server through a reader/writer device.

28. The material management method according to claim 27, wherein the stored data is provided to the client and first to fourth processors through a bus.

29. The material management method according to claim 26, wherein the plurality of memories are protected from the data erasing.

30. The material management method according to claim 26, wherein the material is a wood material.

31. The material management method according to claim 26, wherein each of the plurality of memories has the same data.

32. A material management method comprising the steps of:

attaching a sheet including a plurality of memories to a surface of a material, data of the material having been stored in each of the memories by using a first processor;

wherein data on the material are stored in the plurality of memories and a log preventing a writing is set in the plurality of memories;

dividing the material together into pieces, with the sheet in accordance with data read in the memories by using a second processor, so that the pieces of the material each carry at least one of the memories;

constructing a building by using the divided material in accordance with data read in the memories by using a third processor; and checking the data on the constructed building, which is stored in the memories, canceling the log of the memories, writing a data in the memories, and providing the data to a client by using a fourth processor.

33. The material management method according to claim 32, wherein the data is stored in a server through a reader/writer device.

34. The material management method according to claim 33, wherein the stored data is provided to the client and first to fourth processors through a bus.

35. The material management method according to claim 32, wherein the plurality of memories are protected from the data erasing.

36. The material management method according to claim 32, wherein the material is a wood material.

37. The material management method according to claim 32, wherein each of the plurality of memories has the same data.

38. A material management method comprising the steps of:

attaching a sheet including a plurality of memories each storing data of a material to a surface of the material;

dividing the material and the sheet attached thereto into pieces of divided material in accordance with data stored in the memories, so that the pieces of the material each carry at least one of the memories;

combining the pieces of divided material with at least another material in accordance with the data in the memories.

39. The material management method according to claim 38, further comprising the step of writing data on the dividing step in non-damaged memories after the step of dividing the material.

40. The material management method according to claim 38, wherein the memories comprise write-once memories.

41. The material management method according to claim 38, wherein the sheet is divided so that memories are present on each of pieces of the divided material.

42. The material management method according to claim 38, where the memories are configured so as to uniquely identify each of the pieces of divided material.

* * * * *